US011275873B2

(12) United States Patent
Morton

(10) Patent No.: US 11,275,873 B2
(45) Date of Patent: Mar. 15, 2022

(54) SYSTEM AND METHOD FOR COMPLIANCE, SAFETY AND SPACE MANAGEMENT

(71) Applicant: G. Lori Morton, Greenville, SC (US)

(72) Inventor: G. Lori Morton, Greenville, SC (US)

(*) Notice: Subject to any disclaimer, the term of this patent is extended or adjusted under 35 U.S.C. 154(b) by 296 days.

(21) Appl. No.: 16/377,811

(22) Filed: Apr. 8, 2019

(65) Prior Publication Data

US 2019/0311076 A1    Oct. 10, 2019

Related U.S. Application Data

(60) Provisional application No. 62/653,924, filed on Apr. 6, 2018.

(51) Int. Cl.
*G06F 30/13* (2020.01)
*G06Q 10/06* (2012.01)
*G09B 9/00* (2006.01)

(52) U.S. Cl.
CPC ....... *G06F 30/13* (2020.01); *G06Q 10/06398* (2013.01); *G09B 9/00* (2013.01)

(58) Field of Classification Search
CPC .......... G06F 30/13; G06F 9/451; G06F 16/26; G06F 17/50; G06F 3/14; G06F 16/29; G06Q 10/06398; G06Q 50/163; G06Q 10/087; G06Q 10/10; G06Q 10/06; G06Q 50/10; G06Q 10/00; G09B 9/00; G09B 5/06; G05B 23/0208; G05B 15/02; G05B 19/048; G06K 9/4638; H04L 67/18; G06T 15/00; G06V 3/38; G06N 5/00
See application file for complete search history.

(56) References Cited

U.S. PATENT DOCUMENTS

| | | | | |
|---|---|---|---|---|
| 9,915,929 B1* | 3/2018 | Dubinsky | ............... | G05B 15/02 |
| 10,289,107 B2* | 5/2019 | Warner | ............... | G05B 23/0208 |
| 2011/0087988 A1* | 4/2011 | Ray | ............... | G06Q 10/06 |
| | | | | 715/771 |
| 2014/0365181 A1* | 12/2014 | Cockburn | ............... | G06T 15/00 |
| | | | | 703/1 |
| 2016/0321589 A1* | 11/2016 | Powers | ............... | G06F 16/26 |
| 2017/0235466 A1* | 8/2017 | Tanwir | ............... | G06F 9/451 |
| | | | | 715/738 |

(Continued)

FOREIGN PATENT DOCUMENTS

| | | | | |
|---|---|---|---|---|
| CN | 101540023 A | * | 9/2009 | ............. G06Q 10/06 |
| CN | 102576083 A | * | 7/2012 | ............. G01V 3/38 |
| CN | 102576451 A | * | 7/2012 | ............. G06Q 50/10 |

(Continued)

*Primary Examiner* — Kandasamy Thangavelu
(74) *Attorney, Agent, or Firm* — Kim and Lahey Law Firm LLC; Douglas William Kim

(57) ABSTRACT

A computerized system for managing disparate data comprising: a server in electronic communications with a remote access point and data depositories taken from the group consisting of: physical documents, digital documents, third party databases, regulatory databases, building code databases, or any combination; and, a set of server computer readable instructions that for retrieving disparate information from data depositories, normalizing the data in the data depositories, adding functional overlays to the normalized data, displaying the normalized data in response to a user request.

18 Claims, 18 Drawing Sheets

(56) References Cited

U.S. PATENT DOCUMENTS

2018/0102858 A1* 4/2018 Tiwari .................... H04L 67/18
2019/0020816 A1* 1/2019 Shan .................... G06K 9/4638

FOREIGN PATENT DOCUMENTS

| CN | 103080970 A | * | 5/2013 | ............. G06F 16/29 |
| CN | 103198439 A | * | 7/2013 | ............. G05B 15/02 |
| CN | 106054766 A | * | 10/2016 | ........... G05B 19/048 |
| JP | 2008511934 A | * | 4/2008 | ............. G06Q 10/10 |
| JP | 2017107286 A | * | 6/2017 | |
| WO | WO 2010141601 A2 | * | 12/2010 | ................ G06F 3/14 |
| WO | WO 2013069313 A1 | * | 6/2013 | ............. G06Q 10/00 |
| WO | WO 2016154306 A1 | * | 9/2016 | ............. G06F 17/50 |
| WO | WO 2018051349 A1 | * | 3/2018 | ................ G06N 5/00 |

* cited by examiner

Fig. 11

SYSTEM AND METHOD FOR COMPLIANCE, SAFETY AND SPACE MANAGEMENT

BACKGROUND OF THE SYSTEM

1) Field of the System

This system is directed to an automated system with communications to disparate data source(s) in real time to provide for document management, compliance, safety, training and space management for physical facilities.

2) Description of Related Art

Today, the management and maintenance of a "facility" is becoming more strategically important to organizations. Additionally, failure to properly maintain facilities has increased risks that can results in the loss of physical and financial asserts as well as results in regulatory penalties, property damage, personal injury and even unnecessary loss of life. It has been reported that one of the top concerning for organization is the unnecessary loss of property or personal injury that can be traced to failure with periodically communicate policies and procedures governing environmental protection and occupational safety and reporting job related injuries; failure to ensure all employees have received all required training; failure to monitor and ensure compliance with workplace safety policies and procedures; and failure to have the most current documentation about a facility.

Once aspect of failure in facilities management is the problems with improper documentation outdated documentation or lack of access to documentation. Documents that are associated with a facility can include technical information such as floor plans, systems and sub-systems (e.g. HVAC, plumping, electrical), construction, installation data, operational information and information associated with repairs, and upgrades or major maintenance work. Traditionally, these are kept either in physical form or digitally (but on a local sever) and many times in propriety format so that access to these documents needed for operations, repair, inspection and the like can be problematic. One examples is the storage of technical documents shown in FIG. 1. Such a storage facility can include shelves 10 with technical drawings 12 stacked in on shelf or in bins. When a repair technician is called to a building location, the repair technician needs to have access to the most current set of technical drawings. Typically, these drawings are not kept at the location of the building, but a document repository that is a distance away from the building. Therefore, the technician must travel to the location where the documents and stored, gather the documents, travel to the building and hope that the documents gathered are updated and correct. Otherwise, the technician must return to the document location and start the process again resulting in unnecessary waste of time and resources.

There is also a need in the industry for immediate access to certain documents for emergency situations where delay in access can result in unnecessarily loss of property damage, personal injury and even death. Fire departments desire access to construction documents (e.g. floor plans, utility shutoff, drawings, etc.) when fighting fires or preforming other rescues operations at buildings. Unfortunately, these documents may not be available in sufficient time to assist all first responder and can increase risk to the first responder and the potential victims. For example, in an active shooter situation, the first responders would benefit from current floor plans. Currently, however, these plans are not readily available to all first responders and are localized to each department (e.g. police, fire, ems, etc.). This problem is further complicated in that documents can be printed and stored in physical format, placed in digital format on servers, be in proprietary formats requiring specialized software to view or some combination. It would be advantageous to have a single system that can provide for document access without having to travel to remote locations and accounting for the varying formats of such documents. It would also be advantageous to have a single system that can provide document access which quickly provides emergency documents that can be used by first responders at the site of the emergency.

Another complication with facility management is the volume and the categorization of documents. Not all documents or information is needed by all individuals. For example, architects may need structural documents, fire prevention professionals may need access to fire/heat resistances diagrams (e.g. fire ratings for walls and sprinklers systems), and maintenance technicians to equipment locations and specifications. Further, all these documents are facility specific and should be organized accordingly. These documents should also be maintained so that they are periodically reviewed, and the most current versions are used. When using these documents, some are related to regulatory, safety and internal compliance. For example, fire extinguishers should be routinely inspected based upon a local regulatory schedule. To ensure that all fire extinguishers have been inspected, documents associated with the location of the fire extinguisher should be reviewed so the locations of each fire extinguisher are known, and none are skipped. When inspected, a written verification of the inspection can be stored such as with the form shown in FIG. 2. However, such documentation, while recording the inspection information, does little to manage the compliance process or the associated compliance information. It would be advantageous to have a system that could provide the schedule compliance activities (e.g. safety schedule), provide current, warnings and overdue reminders and associated these with the required documents (physical or not) to insure compliance.

Another deficiency with traditional document and facility management systems is the inability to utilize the documents for space management and allocation without a labor-intensive process. For example, in the health care industry, Medicare/Medicaid reimbursements are a significant part of most health care organizations' revenues. These reimbursement amounts are based upon a complex formula that uses actual costs incurred by an organization when providing care to a Medicare/Medicaid patient and can include department costs centers by square footage allocation. Administrative units can also be used for such calculations and are the designation given the a physical location based upon this function. The federal government can also require that the square footage assigned to each department within a medical facility be accurately determined. Overhead costs of a health care facility can be reimbursed, but only that portion that is allocated to the department by square footage. Overhead costs can include building and fixtures, movable equipment, maintenance and repairs, plait operations, laundry and linens and housekeeping. Therefore, the ability to accurately measure, allocate and assign square footage information of a facility to a department or other category is advantageous.

Many facilities calculate square footage with physical documents (e.g. blueprints, construction drawings) and use a ruler to measure the area and calculate square footage. This method is very inaccurate can yield error upwards of 25%. Some facilities have moved to digital drawings (e.g. CAD) and can reduce the error rate by using the digital version of blueprints as these can be more accurate than the paper drawings and can results in more precise measurement. However, the drawings are not updated and are generally separated from a facilities management system. Further, the typical software platform for creating and manipulating CAD drawings is ill-suited to create square footage calculations that include reports for Medicare/Medicaid purposes, insuring up-to-date drawings, accounting for partial use of a physical space during the reimbursement period, changing use of a physical space during the reimbursement period and associated the physical space with departments.

Training, especially training that is facility dependent needs to be provided, updated and tracked for safety and compliance reasons. This is especially true for on-site contractors, and temporary employees that need training specific to the facility. It would be advantageous to have a way to provide and track training that was facility specific, project specific or both.

Therefore, is it an object of the present system to provide a system with disparate data that can be access remotely from the depository so that the information can be used while physical at a facility.

It is another object of the present system to provide for a consolidated system of receiving, storing, updating and displaying facility centric data without the need to physically travel to the data storage facility

SUMMARY OF THE SYSTEM

The above objectives are accomplished by providing a computerized system for managing disparate data comprising: a server in electronic communications with a remote access point and data depositories taken from the group consisting of: physical documents, digital documents, third party databases, regulatory databases, building code databases, or any combination; and, a set of server computer readable instructions for retrieving disparate information from data depositories, normalizing the data in the data depositories, adding functional overlays to the normalized data, and displaying the normalized data in response to a user request. The server can be in communications with a remote access point and a plurality of disparate data depositories containing information associated with a physical location.

The system can include a set of space calculating computer readable instructions for providing a functional overlay for portioning segments over a floor plan, associated segment specific data portions or segments of the floor plan and calculating the square footage according to the physical properties of the portions or segments and associated data. The set of space calculating computer readable instructions can include instructions for calculating space having dynamic properties such as use, size, accounting unit, department and the like.

The system can include a set of emergency computer readable instructions for displaying normalized data and selected functional overlay data in response to a request to display information used during emergencies, rescue, and the like. The system can include a set of compliance computer readable instructions for retrieving regulatory and compliance information, determine if a predetermined action has been performed according to action information representing the action preformed, determining if the item is in or not in compliance, displaying the results and receiving documents of other information associated with preforming of the action associate with compliance, inspections, reporting and any combination thereof. Compliance items can included any number of items such as inspections, testing, training, upgrades, updates, and the like and can be tracked and included in compliance tracking information.

The system can include a computerized system for managing, virtualizing and augmenting disparate data comprising: a server in communications with a remote access point and a plurality of disparate data depositories containing information associated with a physical location; a set of computer readable instructions that when processed by the server are configured to: retrieve disparate information from at least one disparate data depository, normalize the received disparate information, and add a functional overlay to the normalized data, associate the normalized data with identification data in a many to many relationship providing filtered access to the normalized data and associated functional overlays, and create display information having the normalized data, identification data and associated functional overlays, display a floor plan area representing a physical floor plan of at least a portion of the physical location, superimposing a functional overlap representing a physical dimension of elements of the floor plan keyed to marking attributes of the floor plan, receive a selection of a portion of the floor plan for area calculation, calculate the area of the portion of the floor plan selected and create display information repressing the area of the portion of the floor plan selected, create a training program associated with the physical location, receive training content specific to the physical location, associate an individual with a training program and physical location to create a composite training track, track a progress of the individual through the composite training track, and associate the progress with the physical location, and create display information having a training status, retrieve regulatory compliance data, determine if a predetermined action has been performed associated with the regulatory compliance data, receive action information associated with preforming of the action, determine if the action resulted in compliance, create display information representing compliance, designate at least a portion of the normalize data and associated functional overlay emergency data, create display information having normalize data and associated functional overlay emergency data, and transmit display information to the remote access point of the normalized data in response to a user request.

The system can include depositories that are taken from the group consisting of: physical documents, digital documents, third party databases, regulatory databases, building code databases, construction plans, or any combination thereof and the set of computer readable instructions are configured to normalize the data from the data depositories into a standardized format. The set of computer readable instructions can be configured to associate dynamic properties of the physical location with the area calculated according to the portion of the floor plan selected. Dynamic properties can be selected from the group consisting of physical location, use, accounting unit, space type, occupancy, floor covering, HVAC zone, electrical zone, lighting plan, fire alarm zone or any combination thereof. The set of computer readable instructions can be configured to calculate a square footage of an administrative unit. The set of computer readable instructions can be configured to normalize the received data resulting in a normalized data set having no repeating groups of data and in a one to many relationship with functional overlays. The set of computer readable instructions can be configured associate the normalized data set with inspection tracking information.

The set of computer readable instructions can be configured to associate the normalized data set with compliance tracking information. The disparate information can include inspection information having an attribute taken from the group consisting of inspection item, frequency, due date, status indicator and combination thereof, and the set of computer readable instructions are configured to associate the disparate information with the inspection information to provide inspection information status. The set of computer readable instructions can be configured to determine out of compliance information according to the inspection information, aggregate out of compliance items into an open issues group and create display information including the open issues group. The marking attributes can be room boundaries present on architectural plans.

DESCRIPTION OF THE DRAWINGS

The following description of the system will be better understood by reference to the following drawings that are incorporated and made part of the written specification:

FIG. 11 is a display of aspects of the system.

DESCRIPTION OF THE SYSTEM

Computer readable instructions, when executed by a computer processor, cause the computer to perform a series of steps to accomplish a specific task and results in useful, concrete and tangible results. These computer readable instructions can be tied to a particular machine or apparatus with the specific purpose of executing the computer readable code for accomplishing tangible results and represents and accomplishes the manipulation of physical data.

The detailed description that follows may be presented in terms of program procedures executed on a computer or network of computers. These procedural descriptions are representations used by those skilled in the art to most effectively convey the substance of their work to others skilled in the art. These procedures herein described are generally a self-consistent sequence of steps leading to a desired result when executed by a computer and its processor representing or resulting in the tangible manipulation of physical objects. These steps also require physical manipulations of physical quantities such as electrical or magnetic physical elements and are capable of being stored, transferred, combined, compared, or otherwise manipulated readable medium that is designed to perform a specific task or tasks. Actual computer or executable code or computer readable code may not be contained within one file or one storage medium but may span several computers or storage mediums. The term "host" and "server" may be hardware, software, or combination of hardware and software that provides the functionality described herein.

The present system is described below with reference to flowchart illustrations of methods, apparatus ("systems") and computer program products according to the system. It will be understood that each block of a flowchart illustration can be implemented by a set of computer readable instructions or code.

Elements of the flowchart support combinations of means for performing the special functions, combinations of steps for performing the specified functions and program instruction means for performing the specified functions. It will be understood that each block of the flowchart illustrations can be implemented by special purpose hardware-based computer systems that perform the specified functions, steps, or combinations of special purpose hardware or computer instructions.

The present system is now described more fully herein with reference to the drawings in which the preferred embodiment of the system is shown. This system may, however, be embodied in many different forms and should not be construed as limited to the embodiment set forth herein. Rather, these embodiments are provided so that this disclosure will be thorough and complete and will fully convey the scope of the system to those skilled in the art.

Figure 1A:
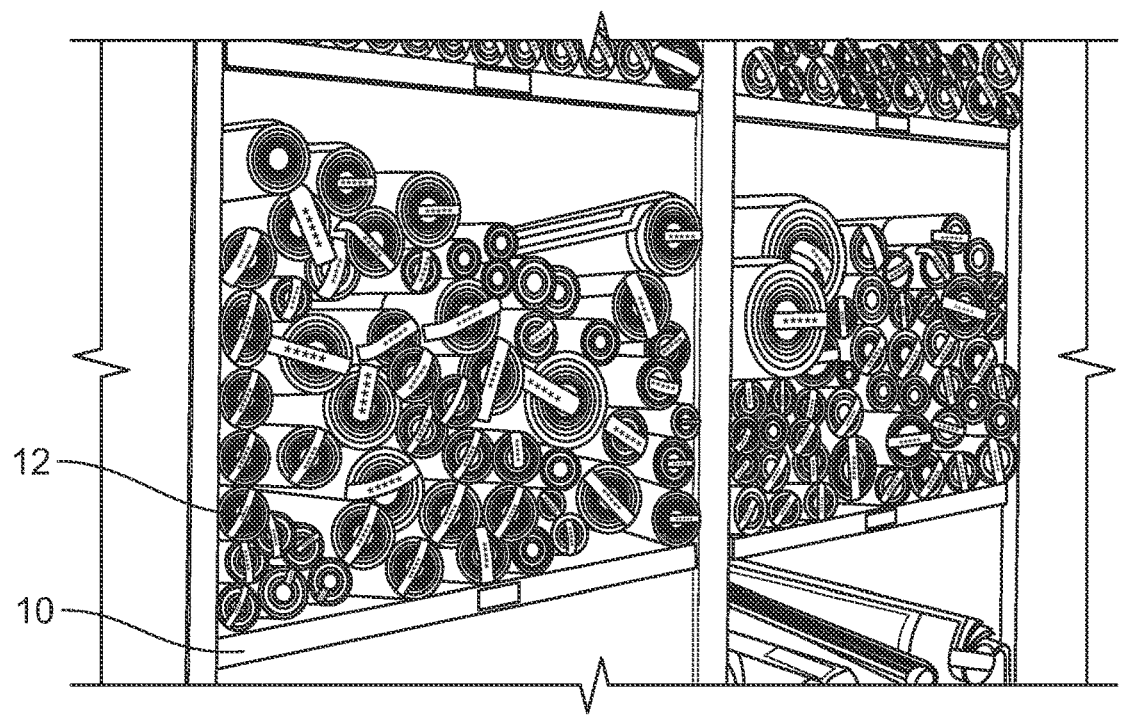
FIG. 1 is an image of the prior art.
Figure 1B:
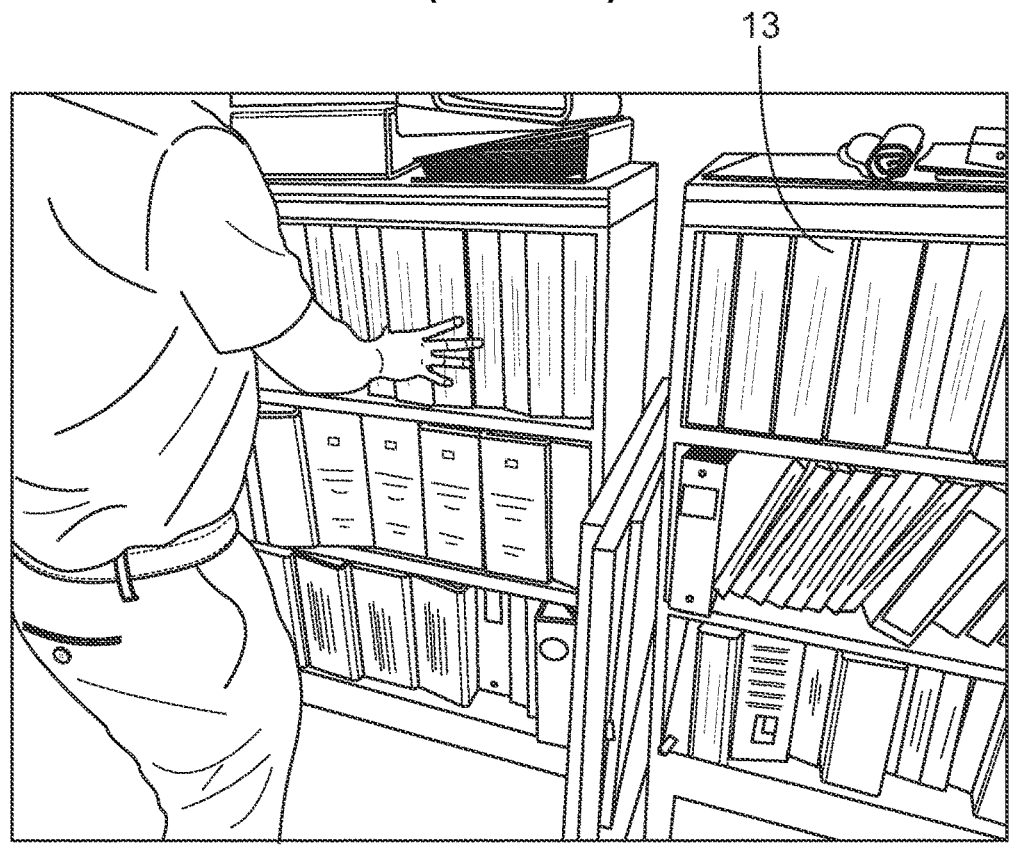

Referring to FIGS. 1A, a traditional storage shelf unit 10 is shown with technical drawings 12 placed in bins. The bins as associated with a facility and illustrate the inefficiencies with current technical document storage and the inability to strategically use these in practical situations. Referring to FIG. 1 B, traditional project binders 11 are shown stored on shelves for the associated project. In this typical storage method, an individual binder contains a portion of the documents (e.g. construction plans, technical diagrams and the like) and information that is associated with a project or a physical location. For example, one binder 13 can include Duct Deflectors, Dampers & Sprinkler Inspections Reports which another binder can include Audio/Visual & Sprinkler Inspection Reports making the location of the information in the binders difficult. Further, this traditional system requires that the binders be properly marked, physically arranged in the same location and grouped by project to prevent unnecessary delay in locating information. Further, the physical binder is necessary to be present for the information to be useful at the job site. Further, the binders are not organized, designed or configured to be used for different applications such as inspections vs. emergencies. This traditional system need much improving.

Figure 2:
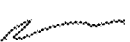
FIG. 2 is an image of the prior art.

FIG. 2 is a sample compliance report 14 memorializing the inspection of an article (e.g. fire extinguisher). This illustrates that there is no connection between the data collected (e.g. inspector and date inspected) and the facility itself. Much improvement needs to be made in the manner in which technical documents are stored and reviewed, facilities management is conducted so that information is linked to facilities and can be strategically used.

Figure 3:
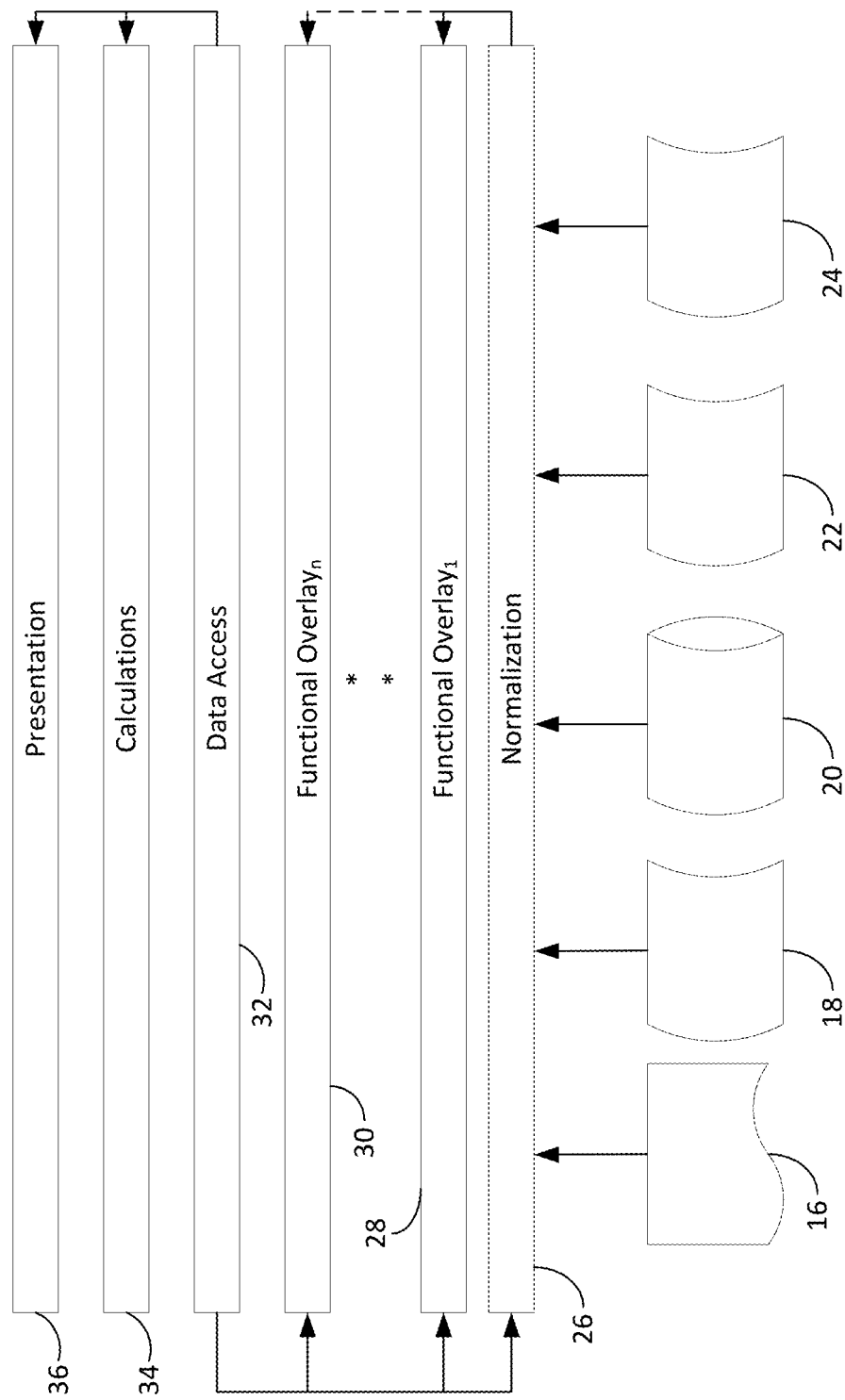
FIG. 3 is a diagram of aspects of the system.

Referring to FIG. 3, the structure of the interconnection of data and information of the present system is shown so that it can be used strategically for facilities management rather than simply a recordation of data. Disparate data sources exist that can include the traditional physical (paper) technical drawings 16 associated with a facility. These technical drawings can be blueprints, electrical diagrams, pluming diagrams, floor plans, property layouts (e.g. landscaping diagrams showing irrigations system, wiring, and the like), equipment diagrams (e.g. circuit diagrams for machinery), and the like. These typically are in physical form (paper) and can be digitally scanned to provide electronic copies of the physical forms. Digitally scanning these physical copies alone, as in the prior art, does not provide the strategic interconnectability without more.

There can also be third party digitally information 18 that is from third parties. For example, a power generator can be located at a facility. This power generator has to be maintenance and potentially repaired from time to time. To assist with these tasks, the manufacturer or vendor can provide technical information about the generator. The information, however, is incomplete in that the information does not have facility specific information such as the location or the electrical system that the generator is connected to. There can also be facility/building specific documents 20 such as structural blueprints, wiring diagrams, plumbing diagrams, landscaping and the like. These documents can be in physical or digital format. In some cases, these documents can be in native formats such as CAD. Some cases the information will be in a proprietary format. There are also regulatory and building code information 22. This information is generally a set of rules that specify the standards that are to be met with facilities (e.g. construction, maintenance, wiring, plumping, fire suppression, occupancy, and the like) and can be industry standards, governmental standards, or internal standards of the facility. This regulatory and building code information can chance with some frequency and needs to be updated from the variety of source in which it exists. There is also information that is generated in the operation and the maintenance of the facility during activities such as inspections, reporting, maintenance and the like. This information can take may forms including that shown in FIG. 2.

A server can be in communications with a remote access point such as a personal computer, smart phone, tablet or other remote computing device. The communications between the server and the remote access point can be wired or wireless. The communications can be through a global communications network, private network, cellular network, local network or any combination thereof. The server can provide hosting computer readable instructions that can be access through the remote access point with common interface software such as internet browsers.

A server can be in communications with data sources such as internal document databases, third party vendors (architects, equipment manufacturers, regulatory agencies), and other computer system, both internal and external. Computer readable instructions can access the disparate data sources and normalize them at 26. Normalization can include conversions of the physical information to digital information, changing format of the information to a common format that can be accessed by the server and its computer readable instructions homogenously, and creating a translation between the native format and common format used by the server and its computer readable instructions. Once the disparate data is normalized, functional overlays can be applied to the normalized data. There can be one functional overlay 28 or multiple functional overlays 30. Functional overlays can include document specific data applied to the normalized data or select items in the data set, categories or grouping data in the normalized data, data associated with portion of the normalized data or individual documents in the normalized data or portion of individual documents in the normalized data. Functional overlays will be discussed in further detail below.

The computer readable instructions can access the normalized data and the functional overlays based upon the data access 32 required or requested. For example, data can be requested that is associated with a particular facility. To provide the ability to access all the data that is associated with a particular facility. Traditionally, an indexed database would have been used to access records that have a field that can be sorted or filters to provide the information for the facility. This requires a database with the appropriate field in the record to allow such access. In the present system, the disparate data sources do not readily lend themselves to such an organization structure as can be from sources such as vendors, internal databases or regulatory organizations. Therefore, the functionally overlay is applied to the data so that the data can be accessed strategically without necessarily needing each data source to have the traditional search fields in the records. With normalized data and functional overlays, calculation 34 can be performed on the data. These calculations can include determining square footage of any number of areas, such as the square footage used by a department or other designation, tracking dates and task completion to provide status of compliance issue such as training and inspections, and report document and functional overlays associated with a number of categories (e.g. discipline, document, equipment, facility, machine, facility, project and the like). The calculations can also include any number of reporting features such as training access, viewing time, training module completion, completion time and other metrics associated with the computer readable functionality that can also be facility specific. The information can also be presented to the user at 36 in various format that include organized by a number of formats on a display.

Information can be output in various formats according to need case and can include spreadsheets, CAD files, dashboards and the like.

Figure 4:
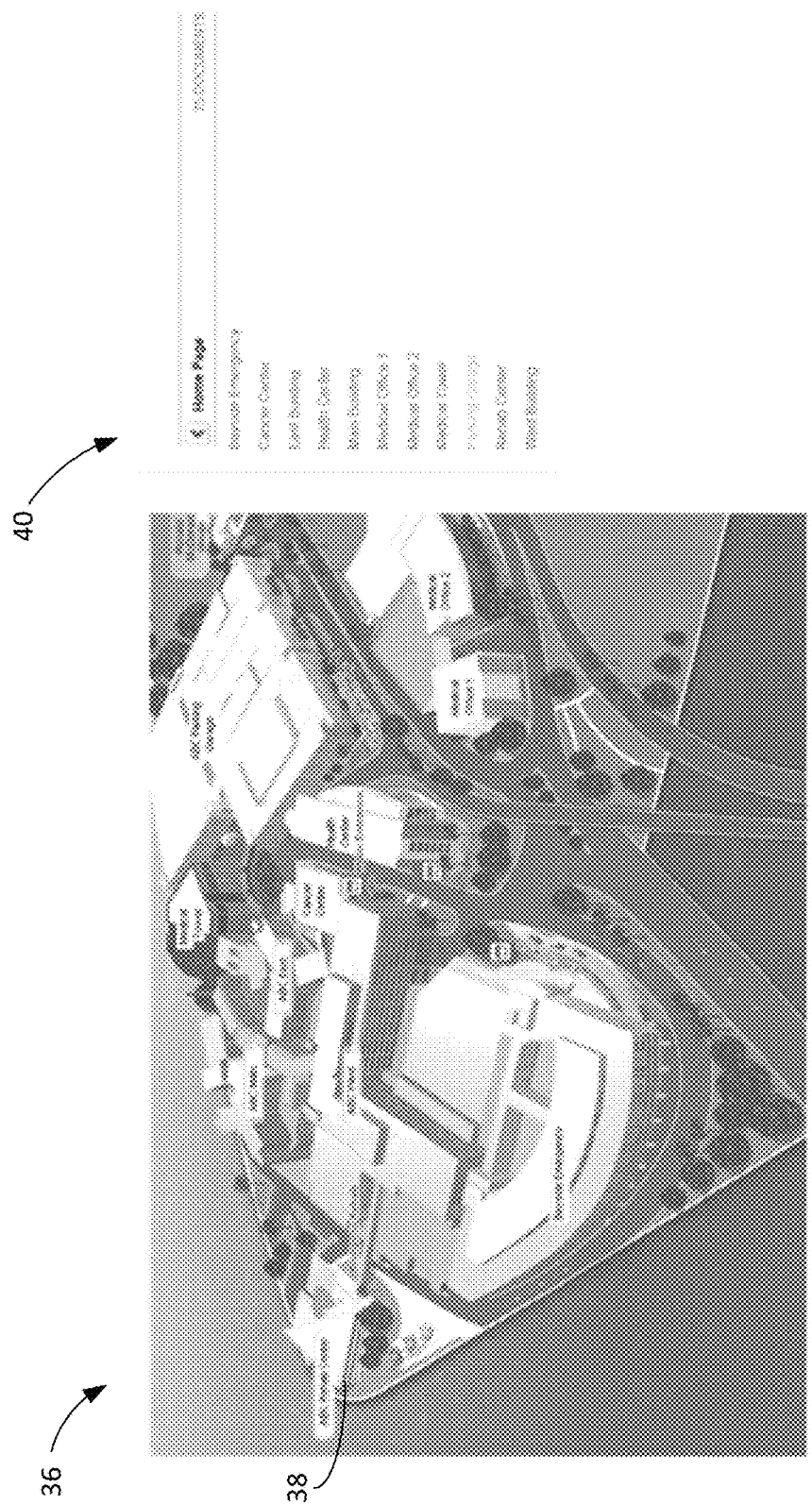
FIG. 4 is a display of aspects of the system.

Referring to FIG. 4, a display view 38 is shown that is a three-dimensional rendering of a particular facility allowing the user to relate the under lying information concerning the physicality to its actual look. The facility can include buildings 38. The representation of the building can provide a portal to the building information associated with the building such as the disparate data and the functional overlays. The user can click on the building or access the building information with the menu 40.

Figure 5A:
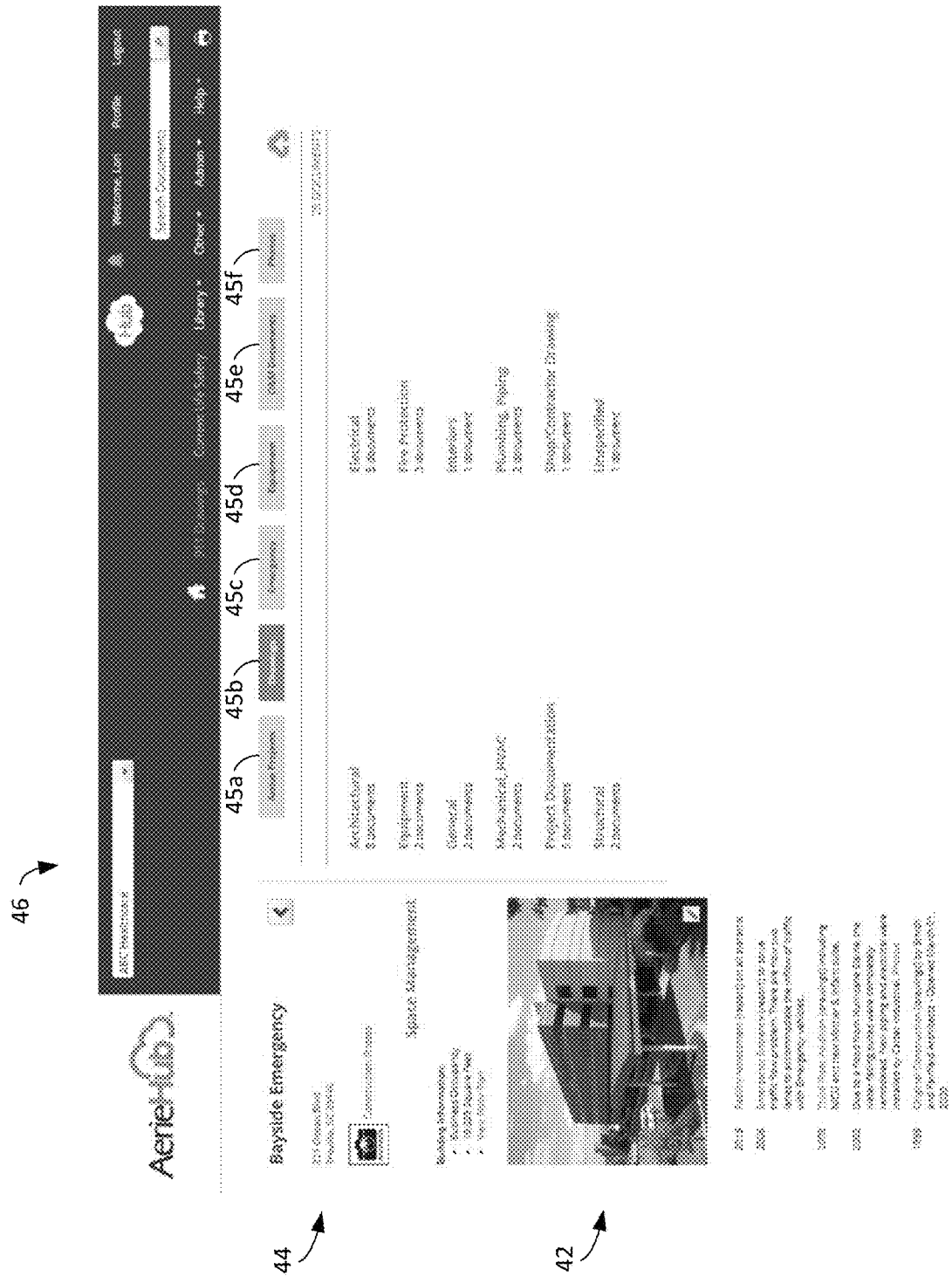
FIG. 5A is a display of aspects of the system.
Figure 5B:
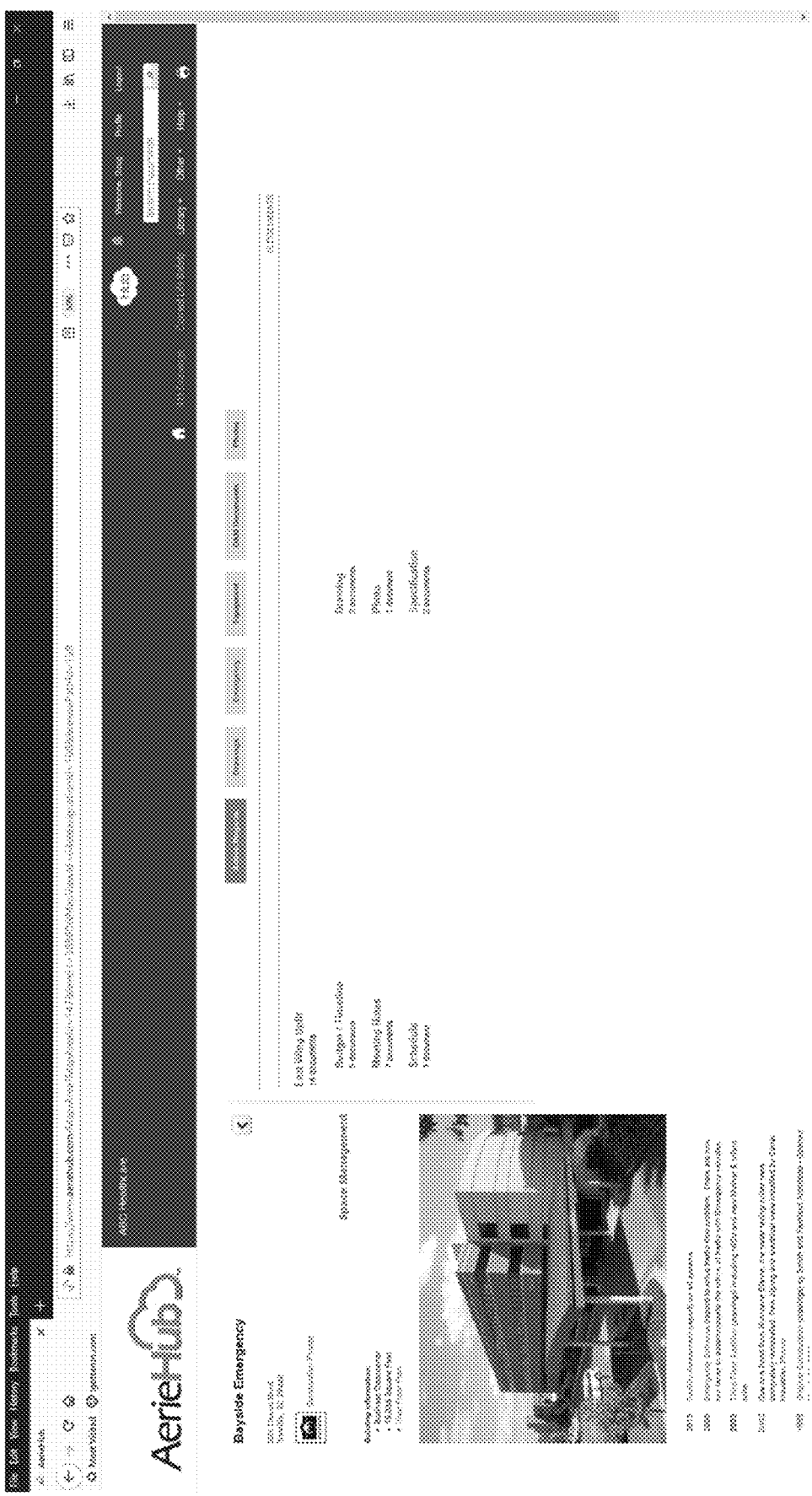
FIG. 5B is a display of aspects of the system.
Figure 6A:
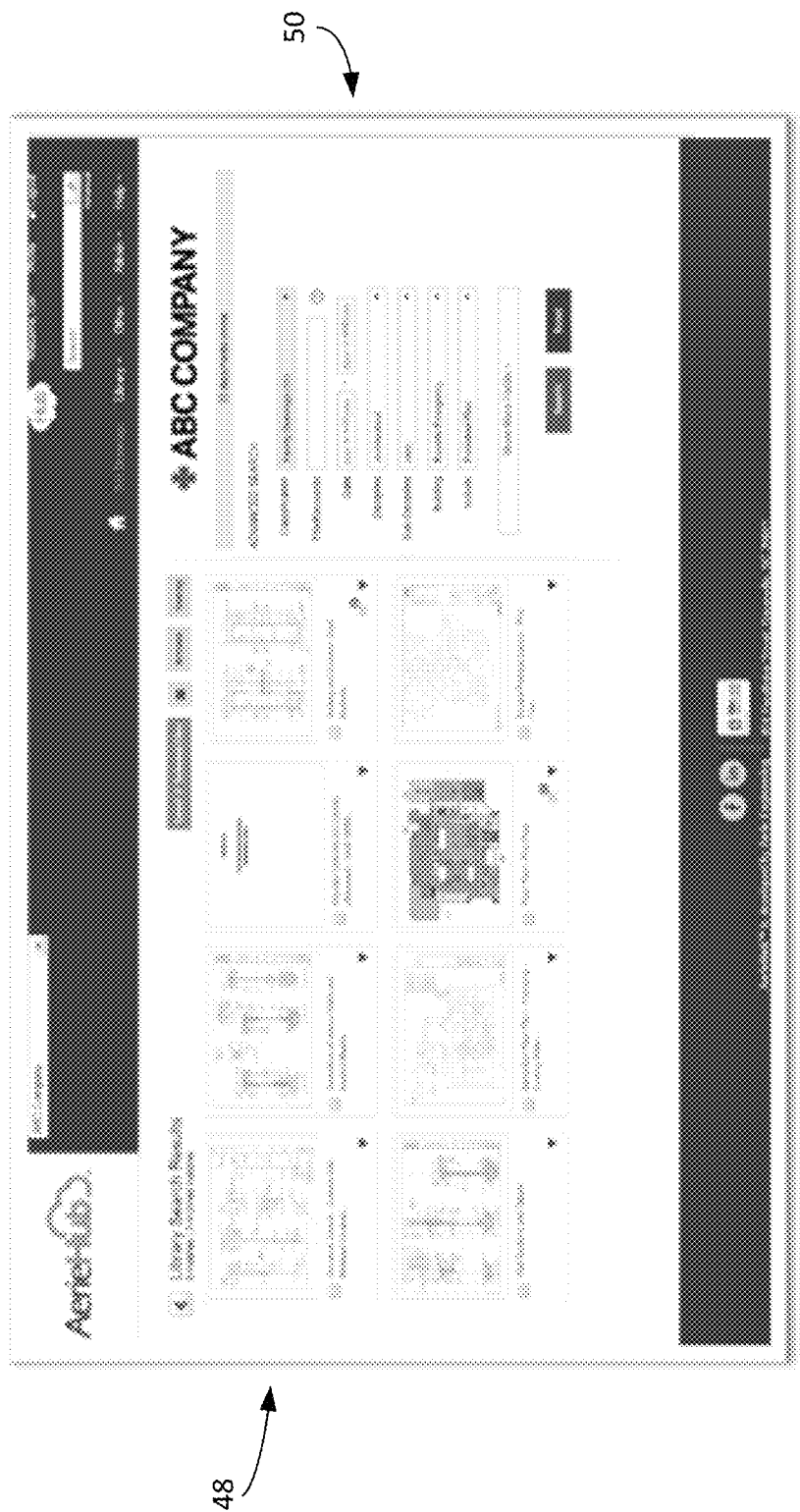
FIG. 6 is a display of aspects of the system.

Referring to FIG. 5A, the building access display can show the building 42, building identification information 44 and the normalized data and functional overlays that are available for viewing 46. The document window 46 includes a description of drawings where the drawings can include the functional overlays from a Drawings selection 45b. Additional selections can include Active Projects 45a, Emergency 45c, Equipment 45d, O&M Documents 45e and Photos 45f. The building can include access to information such as closeouts, O&M (see FIG. 5B), current projects associated with the building and equipment associated with the building. If selecting a drawing 48 (e.g. normalized disparate data and functional overlays) can include document specific information 50 as shown in FIGS. 6A and 6B.

Figure 6B:
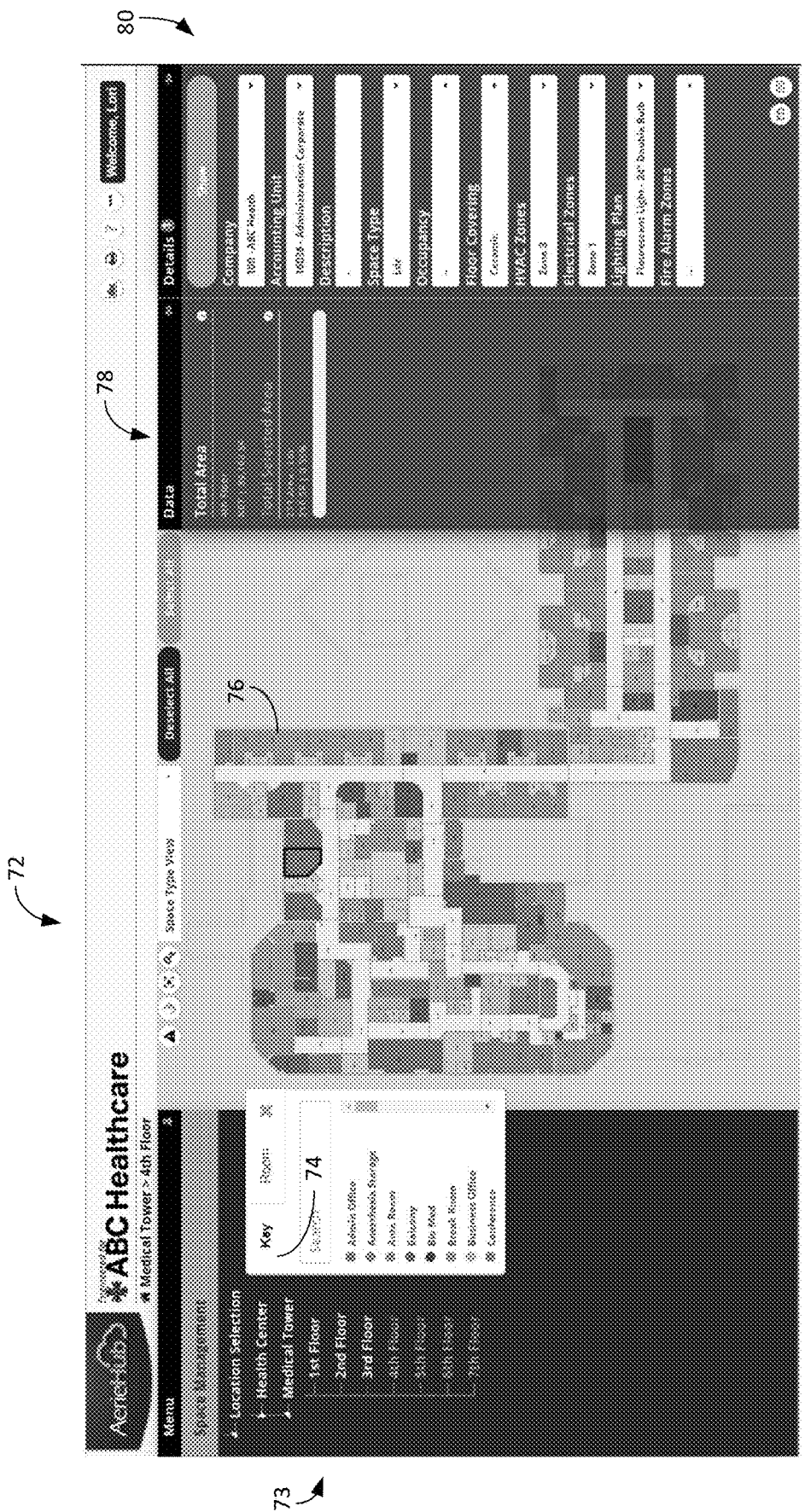

Referring to FIG. 6b, the display associated with the space management functionality is shown. A physical location 72, or portion of a physical location 73, is shown with various areas shown with different designations. In this example, the designation is color coded so that the Administration Office is a first color (e.g. red), the Anesthesia Storage is a second color (e.g. dark purple), the Ante Room is a third color (e.g. light purple) and so on. A key 74 can be provided to associate the indicator and designation. Using the graphical representation of the physical location 76, one or more areas can be selected, and the area of the selection can be displayed in area window 78. Details of the selected area can be displayed on the detail window 80 including the location (e.g. company), accounting unit, description, space type, occupancy, floor covering, HVAC zone, electrical zone, lighting plan and fire alarm zone.

The document data can be a representation of one of the functional overlays associated with the document that can associated information such as classification, title, keywords, creation date, date ranges (creation, access, modifications, printing and like), discipline, sub-discipline, building, and other disparate data or files included with the drawing. Additional information that can be associated with the document with a functional overlay includes project type, originator, project name, drawings numbers or other identifiers, document types (e.g. budget, timelines, drawings, meeting notes, photos, schedules, specification and the like, all of which can be provided through a functional overlay), comments, tags, native file extensions include files, publication date, review status review group and the like. From this view, the user can also modify information (e.g. functional overlays) associated with the document such as inclusion in emergency (911) drawings, if open issues are present or if designated recorded or as-built. Because the system uses functional overlays as well as native format for the disparate date, documents can be provided in multiple formats such as PDF or DWG without losing or replicating the functionality of the system. The information associated with disparate data (e.g. drawings) can be searched across the functional overlays.

One example of a functional overlays can also include augmentation information associated with the physical location represented by the normalized data such as the physical dimensions of the physical location. In this case, the functional overlay can have the dimension of the rooms of a floor and hallways, for example, and the computer readable instructions can key the functional overlay to the normalized data by matching boarders, walls and the like (e.g. marking attributes). Marking attributes can also be added to the normalized data such as symbols associated with the normalized data to represent corners, sides, or other area of the normalized data to be used to associate the functional overlay. The functional overlay can then be viewed and analyzed as composite data such as when it is desired to discover the square footage of at least a portion of the physical location.

Figure 7:
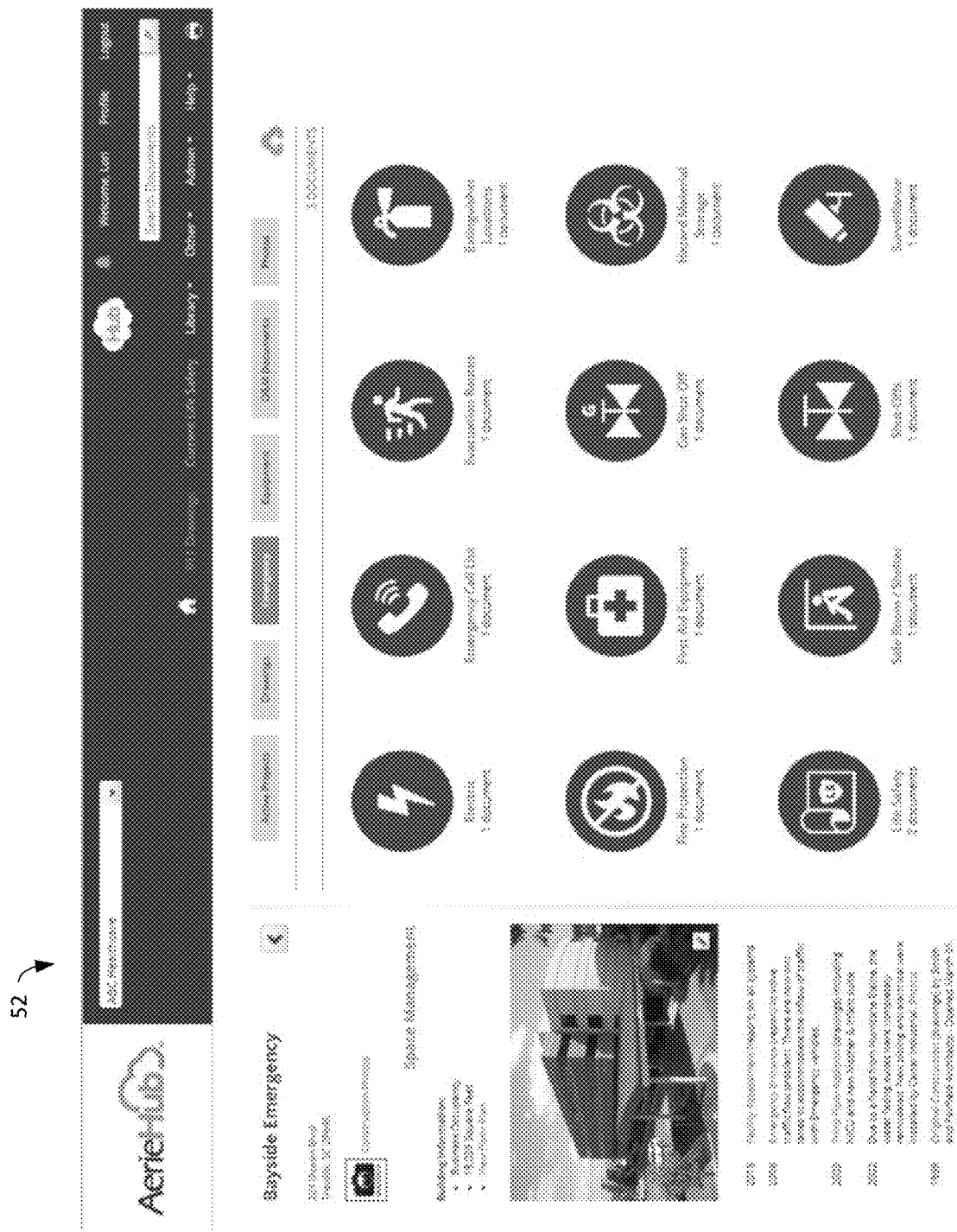
FIG. 7 is a display of aspects of the system.

Referring to FIG. 7, the system can specifically provide for an emergency (911) access portal that can be used and immediately available in the event of an emergency. For example, from a main access screen, there can be a 911 drawings selection that can provide the view of FIG. 4 but bordered with red to indicate 911 access. When the building is selected, the view of FIG. 5 can be displayed with a red border placed around the image of the physical building and the information associated with the building and designated 911 information is shown. Documents and information associated with an emergency situation can be displayed so that unneeded information is automatically filtered for the first responder. The user can also be presented with emergency screen 52 that can provide fast access to emergency call lists, evacuation routs, fire extinguisher locations, fire protection systems, first aid equipment, safe room information, shelter information, various shut-off stations, valves and the like, surveillance systems and equipment, floor plans, gas lines, electrical diagrams, pluming diagrams, emergency call lists, security system (diagrams, video, access, etc.), hazardous material location and the like. The disparate data can be organized with a functional overlay associated with emergency documents to provide real time access to such documents without unnecessary filters, searching or other retrieval of information. Pertinent information such as building size, exits, support structure (metal, wood, singles, etc.), internal uses (day care, classroom, etc.) can also be provided. In one embodiment, the Google Earth information associated with the building can be accessed. In one embodiment, the security system information can include access to the third-party information by allowing the user to sign-in to the third-party security vendor.

Figure 8:
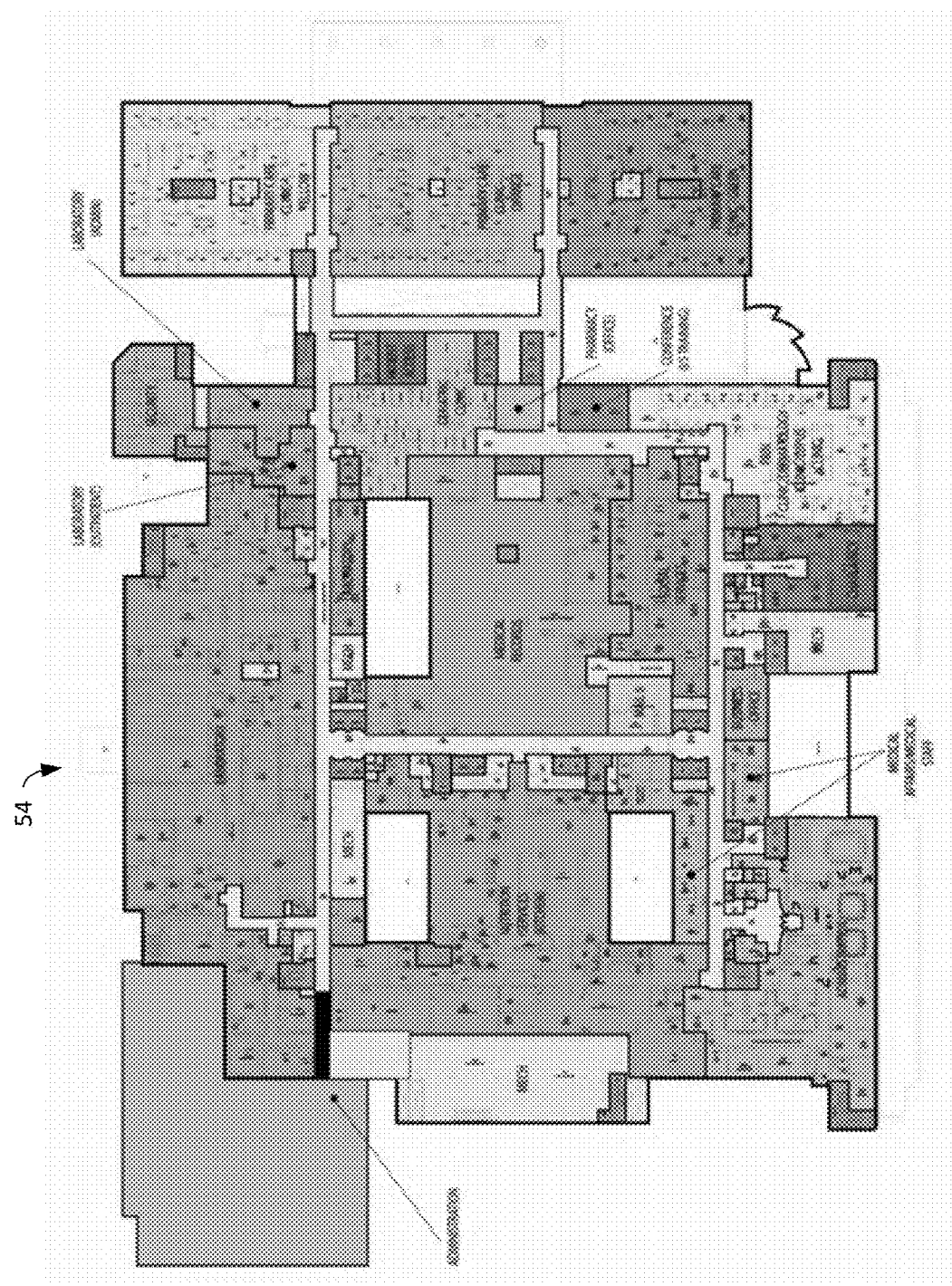
FIG. 8 is a display of aspects of the system.
Figure 9:
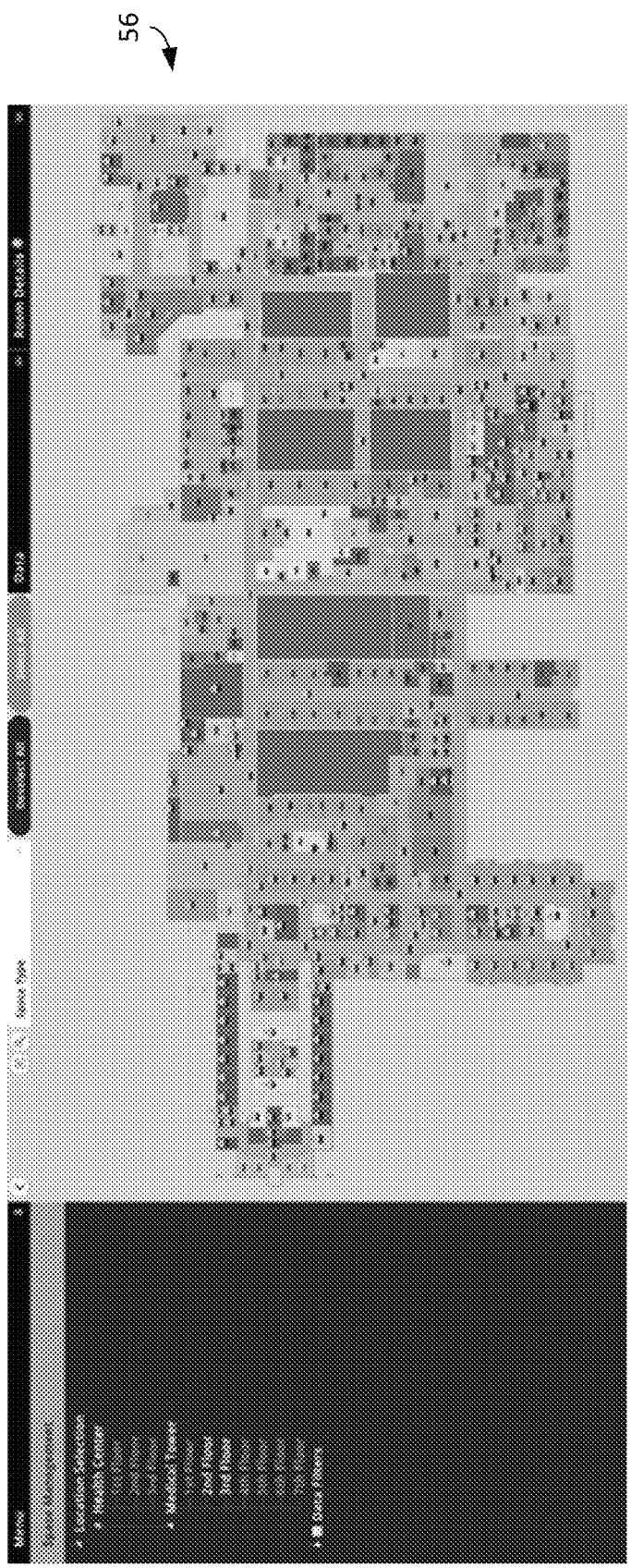
FIG. 9 is a display of aspects of the system.
Figure 10:
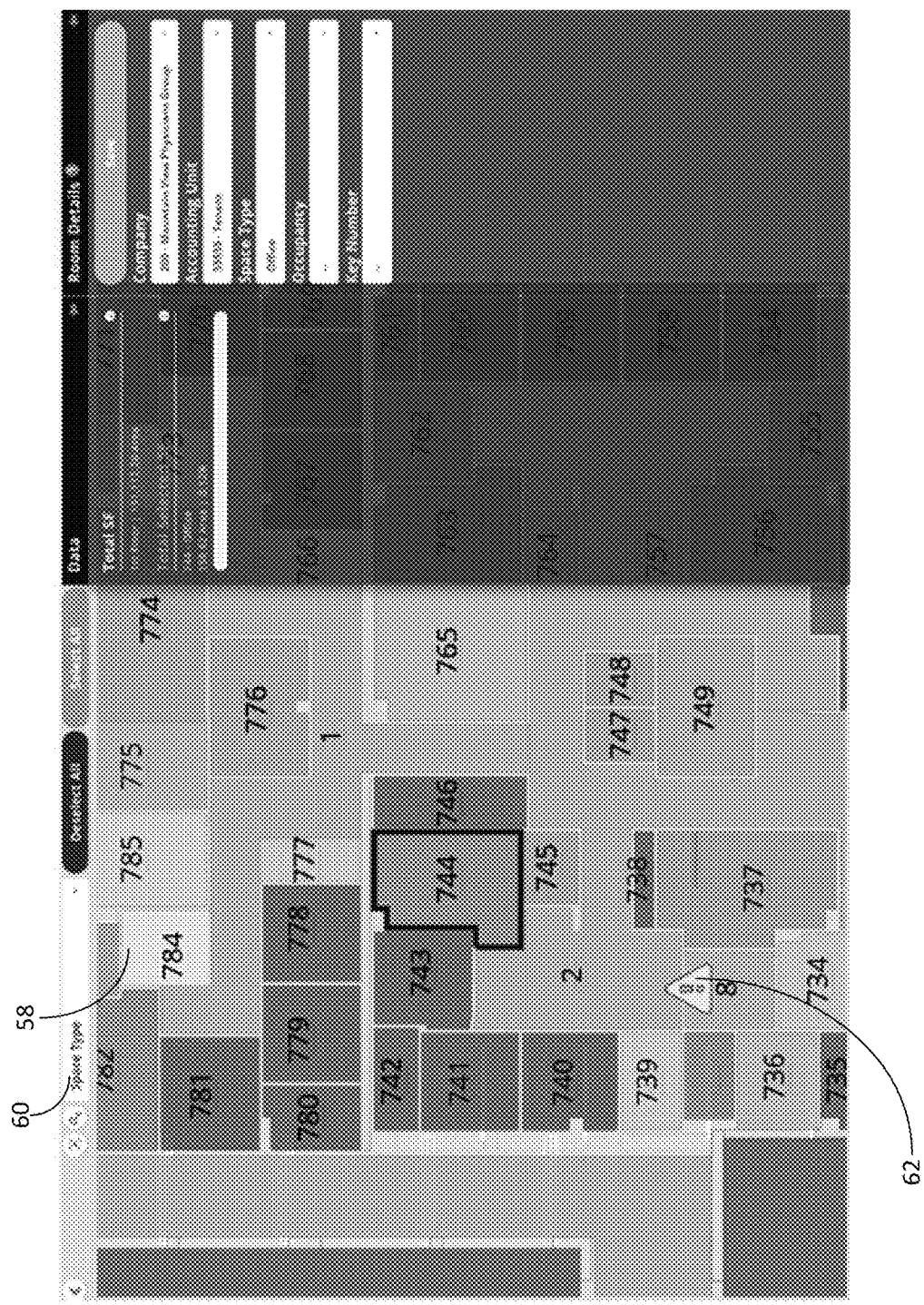
FIG. 10 is a display of aspects of the system.

When a document is selected, such as a floor plan shown in FIG. 8, the raw or normalized data can be displayed. For example, a floor plan 54 can be displayed in its native of normalized formats. The user has the ability to scroll, magnify, or otherwise view or manipulate the document. In one embodiment, the disparate data can be a floor plan 56 as shown in FIG. 9. The disparate data can include a functional overlay associated with space management. The functional overlay can virtually segment the floor plan into discreate sections such as a room, hallway, access corridor, closet, and the like. Another functional overlay can include data associated with the segment that can include information such as shown in FIG. 10. A room 58 can have a space type 60 included in a functional overlay that includes space type 60 that can include company, accounting unit, occupancy and the like. The functional overlay allows the native format to be maintained while assigned logical units that can be delineated down to room portions. Each portion can include information such as location (e.g. building, floor, section), selected square foot, company, accounting unit, space type, occupancy and key number. In one embodiment, the key number can be used to highlight the access (rooms, hall ways and corridors) that are accessible by the key number allowing a visual representation of the access provided. This functionality allows the user to verify or modify access based upon the key and demine is the access is correct.

When information about a portion is not available or missing, a space management warning 62 can be displayed.

Using the functional overlay to include space information, calculations can be made to determine the use of the facility by square foot and by use type for purposes such as space management and allocation. One functional overlay can include temporal information so that the information associated with a portion can be calculated for a period of time, even when the purpose, use and event segments change in the accounting period, reimbursement period of other time frame. For example, when a room or segment is used for a recovery area in a hospital for a portion of a year and then converted to pre-op for a portion of the year, the use of functional overlays allows for accurate calculations even when area use changes over time within the accounting period.

Figure 11:
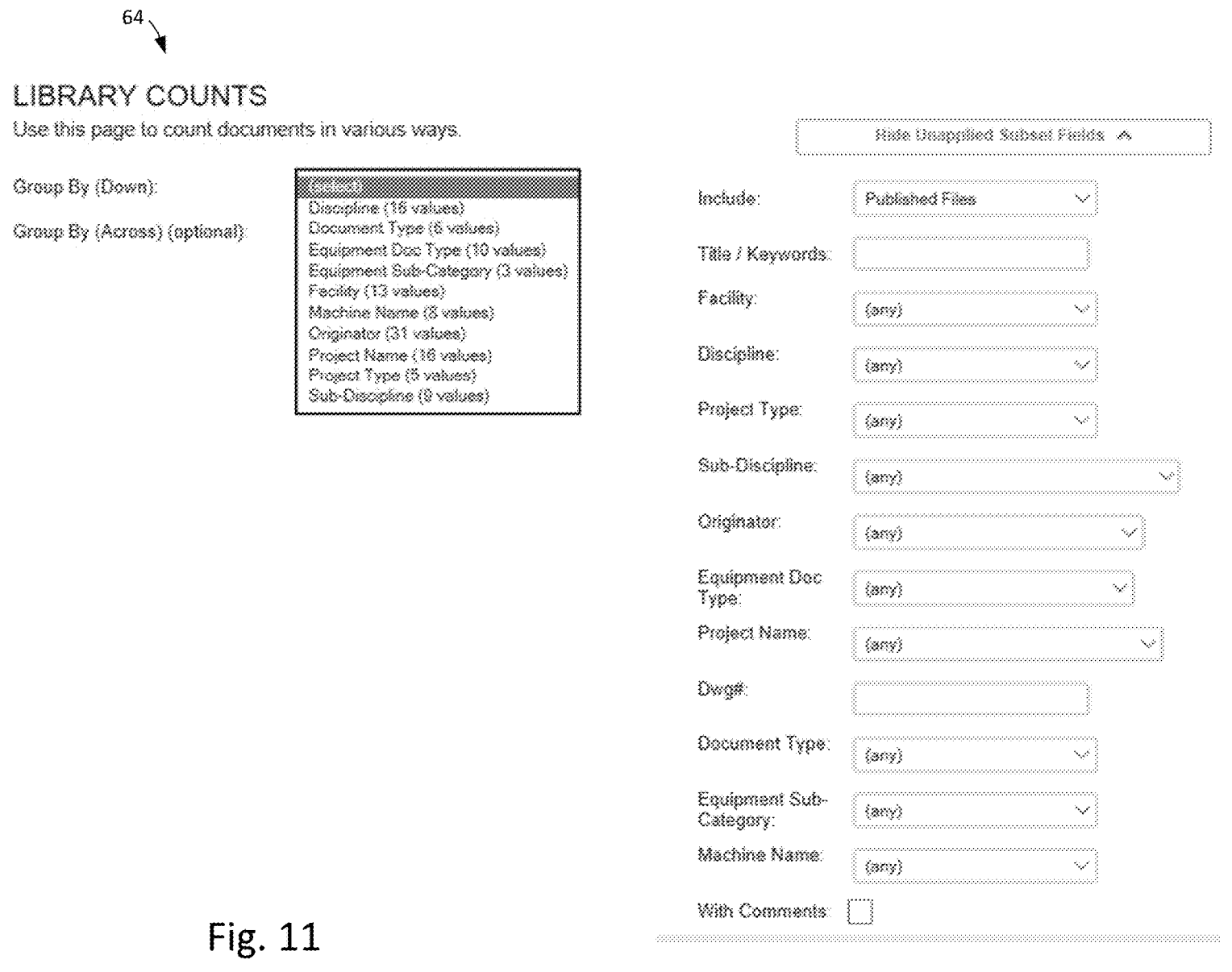
Figure 12:
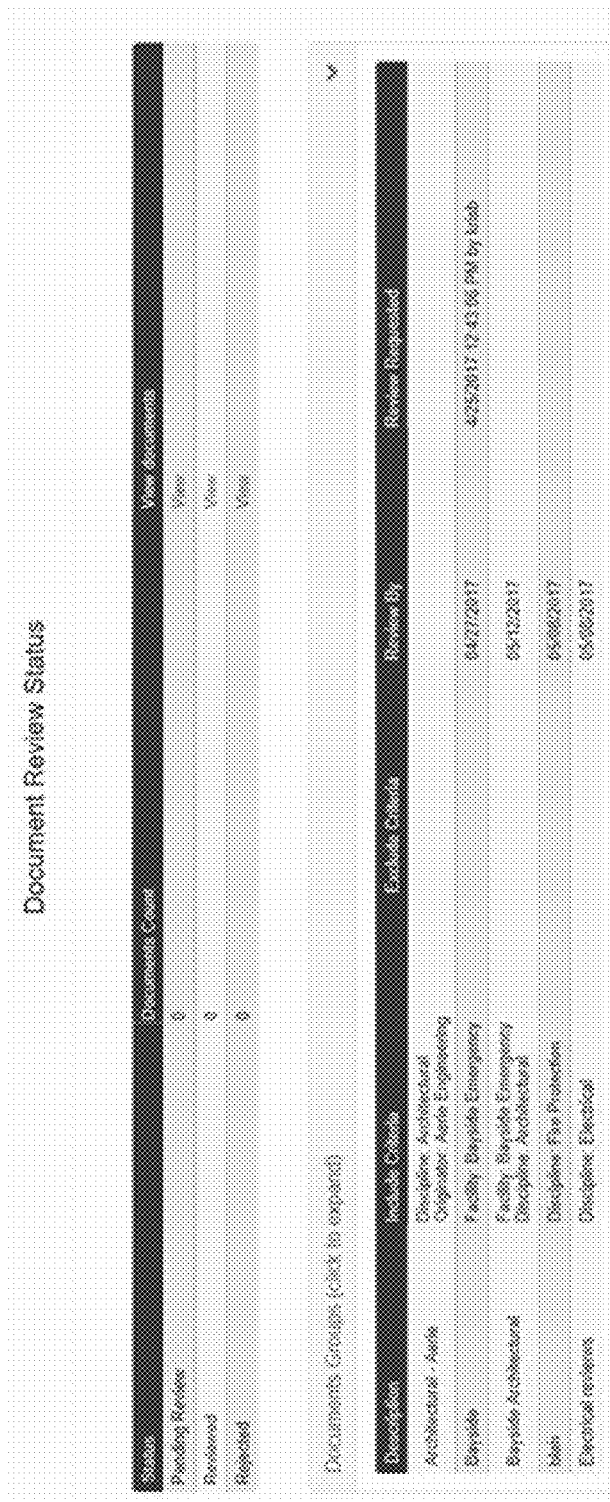
FIG. 12 is a display of aspects of the system.

Referring to FIG. 11, one aspect of the system can include a library count 64 of normalized data and functional overlays. Various combinations of the normalized data and the functional overlays can be assigned to native data and can include discipline, document type, equipment document type, equipment sub-category, machine name, facility, organizer, project name, project type and sub-discipline. Referring to FIG. 12, the native, raw or normalized data can include a review status that can track reviews, modifications, review requests, updates and the like.

Figure 13:
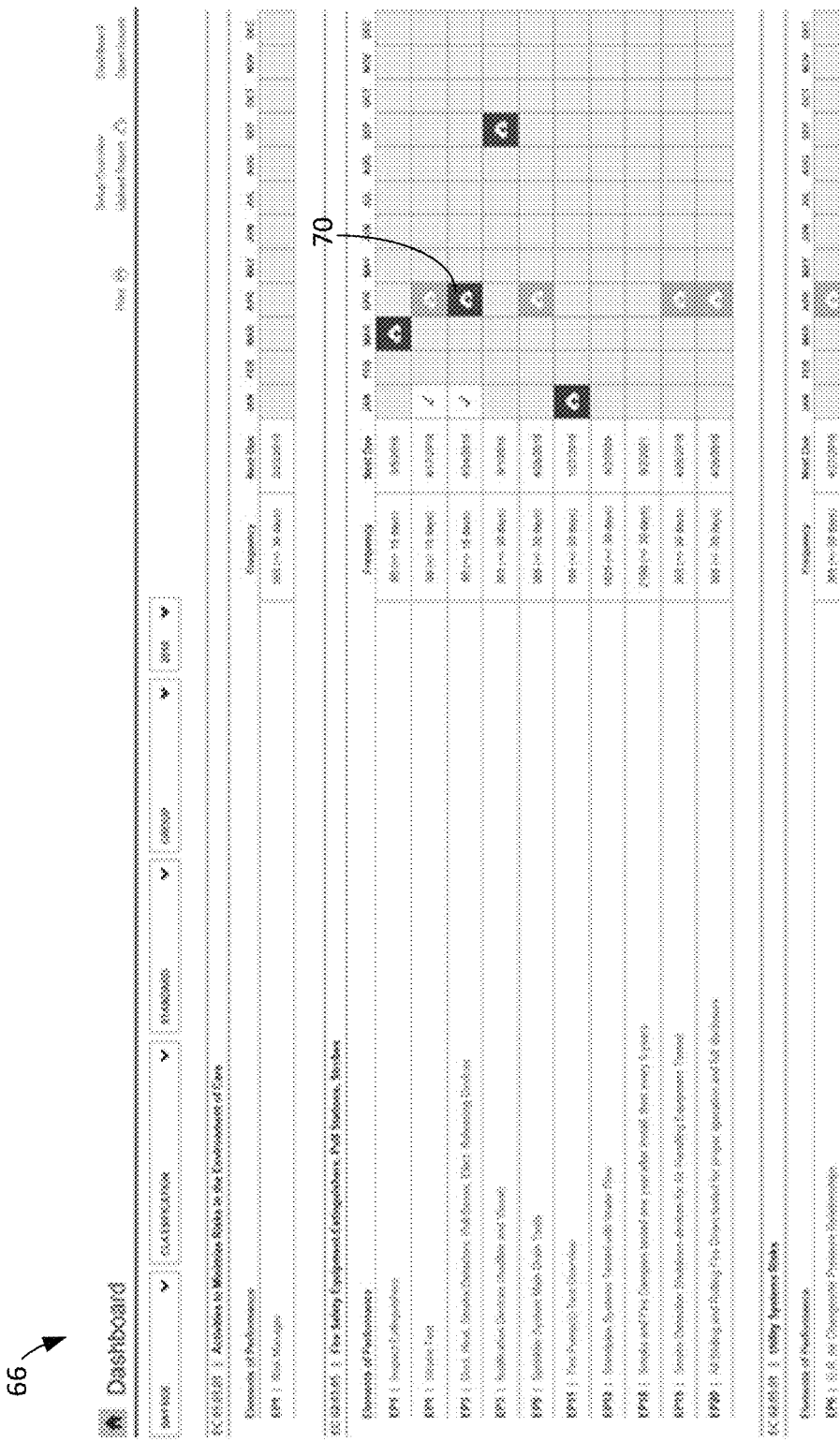
FIG. 13 is a display of aspects of the system; and,
FIGS. 14A through 14E are displays of aspects of the system.

Referring to FIG. 13, the system can also include the ability to associate compliance information that can be a collection of regulatory information, third party (e.g. vendor or regulatory) information, internal practices and other information designed to establish a structure for the inspection or maintenance requirements associated with the facility. Due to the use of overlays that can be associated with a facility, building, equipment and the like, a dashboard 66 can be provided that shows the item for inspection tied to the facility, building, project, system (e.g. electrical, plumbing, etc.) equipment and the like. The frequency of the inspection or maintenance activity can be included with due dates and graphical representation of status directed to compliance, inspection, repairs, and can include a warning that the date is approaching or a warning that a date was missed. The dashboard can also provide for an upload function 70 allowing supporting information or documentation to be associated with the activity. The uploaded information can include the location (facility or building), classification, compliance standards, performance elements and tasks. The task date (e.g. test date) can be included, whether deficiencies exist, comments and document status (e.g. the document uploaded is for status in advance of the due date, with the due date or is historical information).

Figure 14A:
Figure 14B:
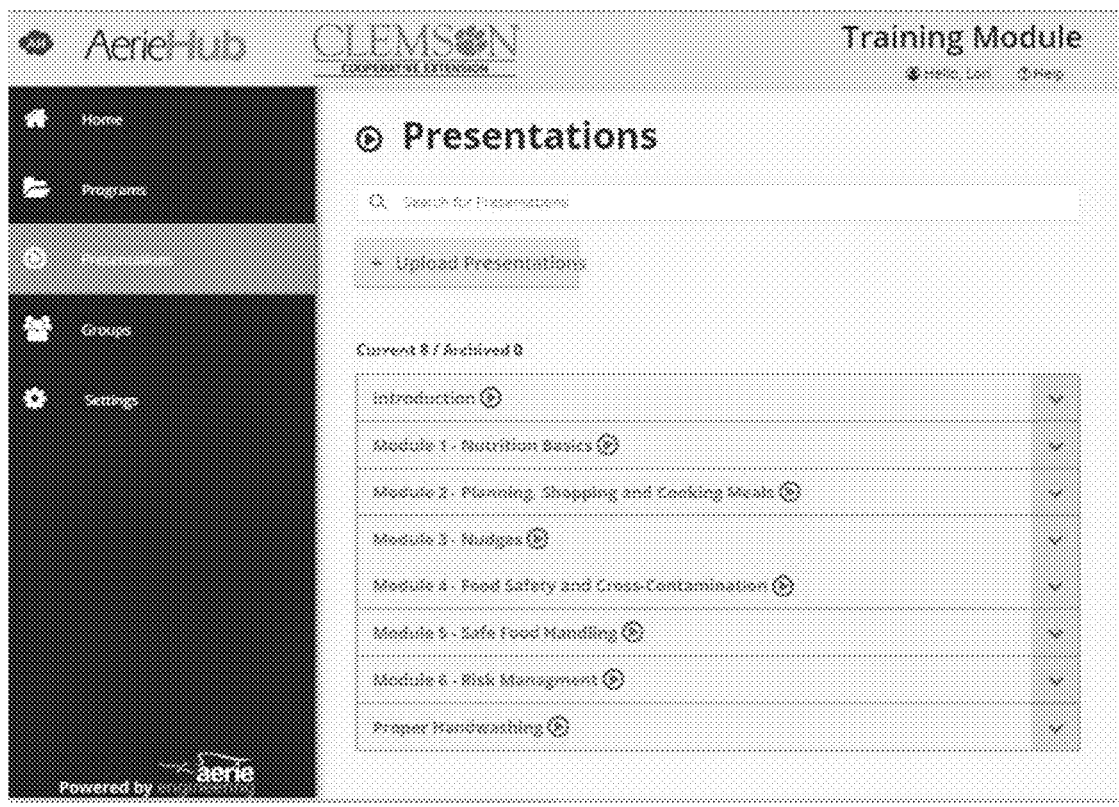
Figure 14C:
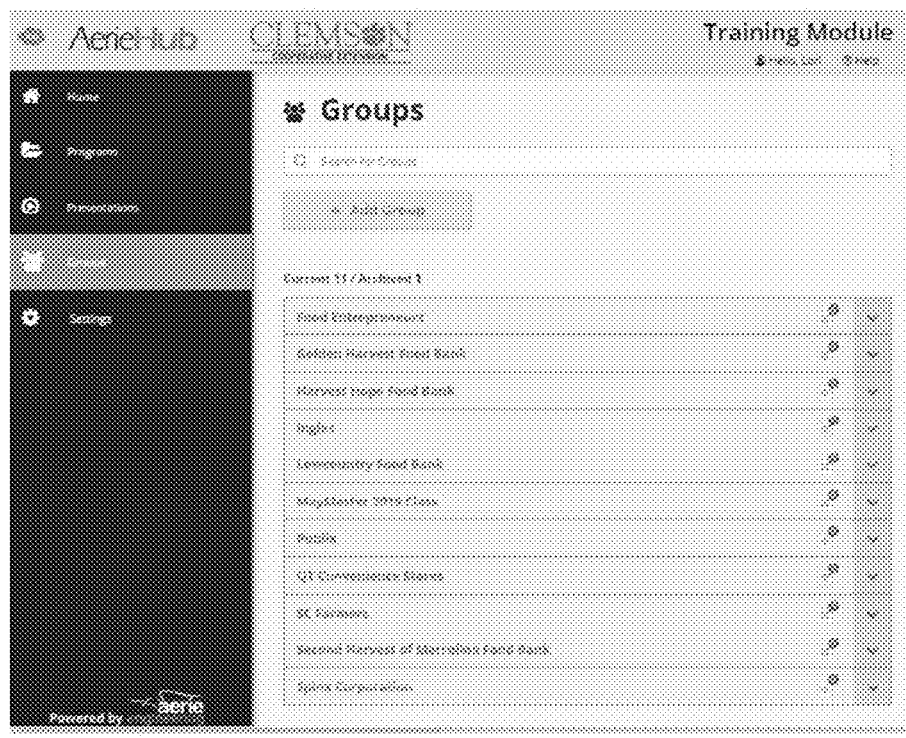
Figure 14D:
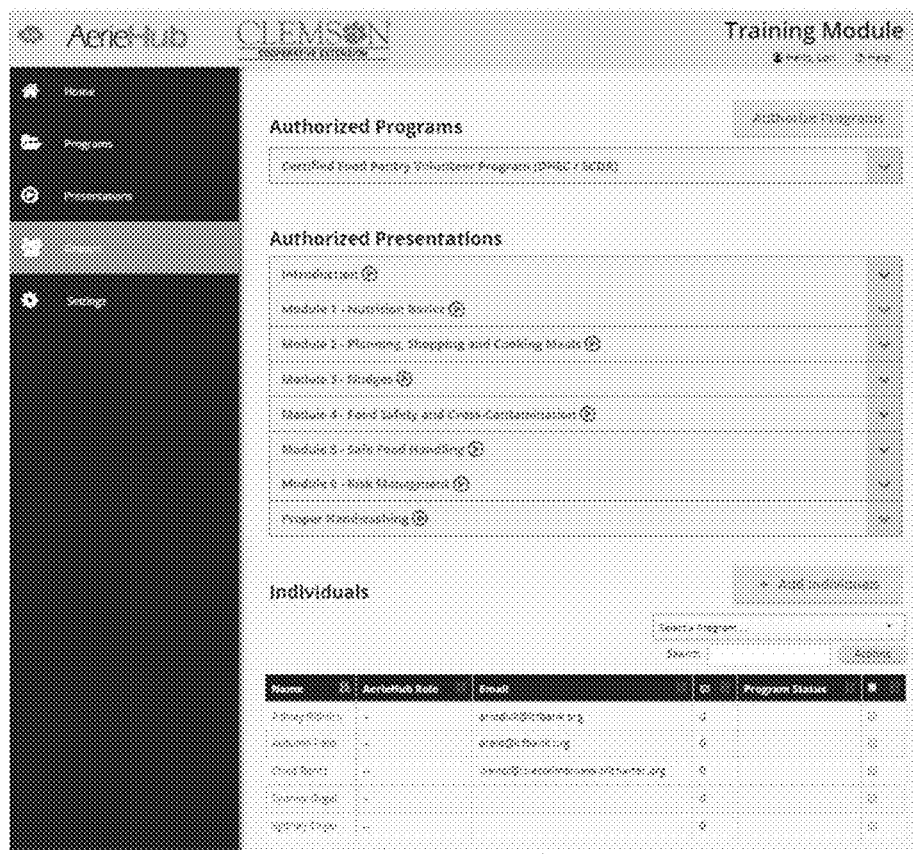
Figure 14E:
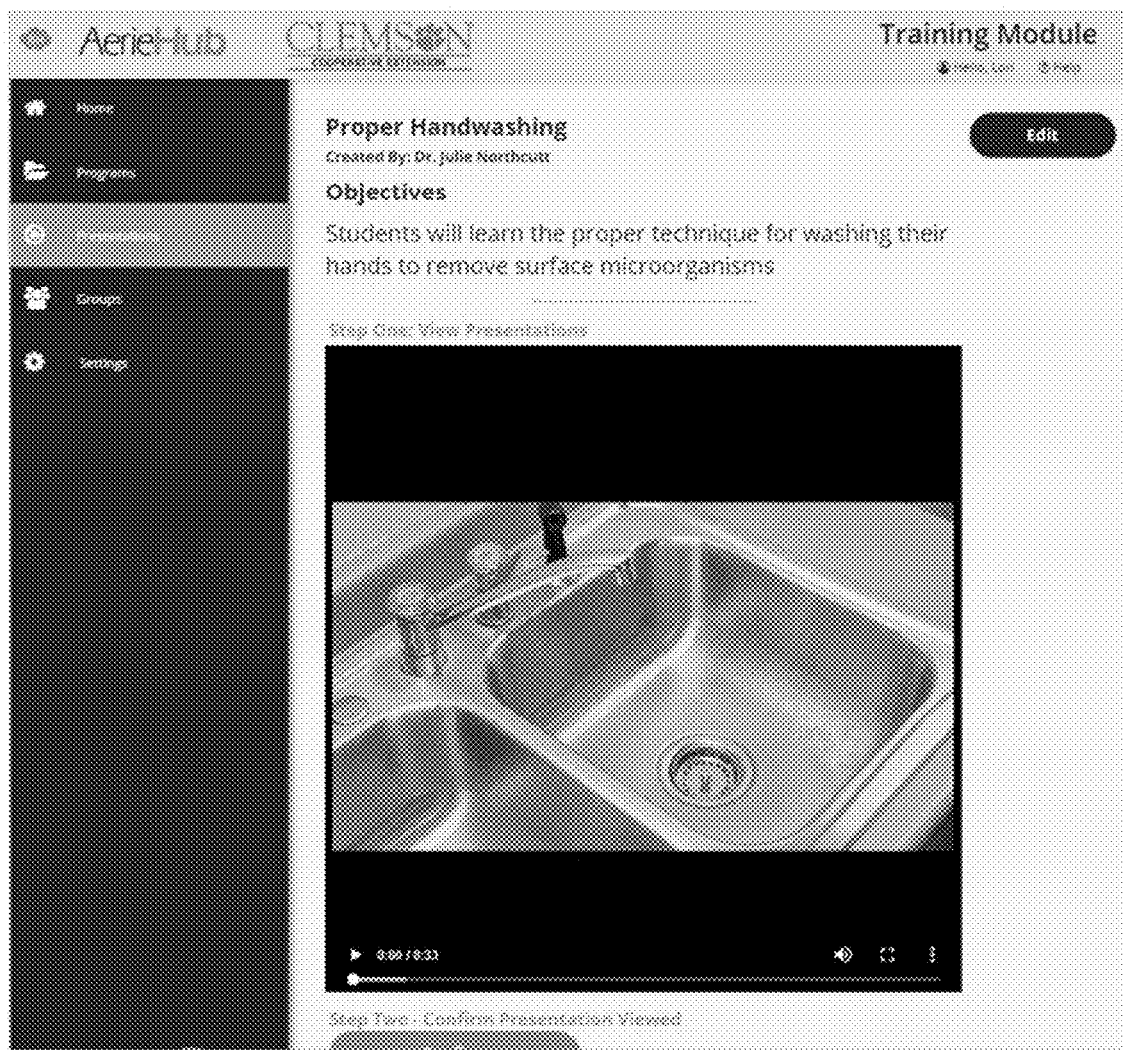

Referring to FIG. 14A, the training modules can be created that are facility specific and associated with the physical representation of the facility or other information described herein. A training program can be created at 82 and can be associated with a physical location if desired. For eaxmple, it may be desired for individuals at one location to participate training specific to that location while a second location may have additional or modified training programs, needs and requirements. The training program can be listed at 84 and selected for review. Referring to FIG. 14B, portion of a training program can be accessed such as video content 86. The portions can be selected and reviewed. As portion are created, modified or deleted, they can be added, updated of removed from the program. Completion of the training program can be recorded with the facilities information so that a complete record of the training for that facility can be maintained. Referring to FIG. 14C, groups can be created, and portion of programs can be associated with these groups so that efficiencies are realized and creating training modules. Referring to FIG. 14D, the portion of a training program can be authorized for a specific physical location, group or individual. Further, certain presentations can be authorized for the physical locations, group or individual. Referring to FIG. 14E, an example of a portion of a prestation is shown.

It is understood that the above descriptions and illustrations are intended to be illustrative and not restrictive. Other embodiments as well as many applications besides the examples provided will be apparent to those of skill in the art upon reading the above description. The scope of the system should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. The omission in the following claims of any aspect of subject matter that is disclosed herein is not a disclaimer of such subject matter, nor should it be regarded that the inventor did not consider such subject matter to be part of the disclosed inventive subject matter.

What is claimed is:

1. A computerized system for managing, virtualizing and augmenting disparate data comprising:
a server in communications with a remote access point and a plurality of disparate data depositories containing information associated with a physical location;
a set of computer readable instructions that when processed by the server are configured to:
retrieve disparate information from at least one disparate data depository, normalize the received data, and add a functional overlay to the normalized data,
associate the normalized data with identification data in a many to many relationship providing filtered access to the normalized data and associated functional overlays, and create display information having the normalized data, identification data and associated functional overlays
display a floor plan area representing the physical floor plan of at least a portion of the physical location, superimposing a functional overlap representing the physical dimension of elements of the floor plan keyed to marking attributes of the floor plan, receive a selection of a portion of the floor plan for area calculation, calculate the area of the portion of the floor plan selected and create display information representing the area of the portion of the floor plan selected,
create a training program associated with the physical location based on the normalized data and associated functional overlays, receive training content specific to the physical location, associate an individual with a training program and physical location to create a composite training track, track a progress of the individual through the composite training track, and associate the progress with the physical location, and create display information having a training status,
retrieve regulatory compliance data, determine if a predetermined action has been performed associated with the regulatory compliance data, receive action information associated with preforming of the action, determine if the action resulted in compliance, create display information representing compliance,
designate at least a portion of the normalized data and associated functional overlay emergency data, create display information having normalized data and associated functional overlay emergency data, and
transmit display information to the remote access point of the normalized data and the individual's training status in response to a user request.

2. The system of claim 1 wherein the data depositories are taken from the group consisting of: physical documents, digital documents, third party databases, regulatory databases, building code databases, construction plans, and any combination thereof and the set of computer readable instructions are configured to normalize the data from the data depositories into a standardized format.

3. The system of claim 1 wherein the set of computer readable instructions are configured to associate dynamic properties of the physical location with the area calculated according to the portion of the floor plan selected.

4. The system of claim 3 wherein the dynamic properties are selected from the group consisting of physical location, use, accounting unit, space type, occupancy, floor covering, HVAC zone, electrical zone, lighting plan, fire alarm zone and any combination thereof.

5. The system of claim 4 wherein the set of computer readable instructions are configured to calculate the square footage of an administrative unit.

6. The system of claim 1 wherein the set of computer readable instructions are configured to normalize the received data resulting in a normalized data set having no repeating groups of data and in a one to many relationship with functional overlays.

7. The system of claim 6 wherein the set of computer readable instructions are configured to associate the normalized data set with inspection tracking information.

8. The system of claim 6 wherein the set of computer readable instructions are configured to associate the normalized data set with compliance tracking information.

9. The system of claim 1 wherein the disparate information includes inspection information having an attribute taken from the group consisting of inspection item, frequency, due date, status indicator nd combination thereof, and the set of computer readable instructions are configured to associate the disparate information with the inspection information to provide inspection information status.

10. The system of claim 9 wherein the set of computer readable instructions is configured to determine out of compliance information according to the inspection information, aggregate out of compliance items into an open issues group and create display information including the open issues group.

11. The system of claim 1 wherein the marking attributes are room boundaries present on architectural plans.

12. A computerized system for managing, virtualizing, and augmenting disparate data comprising:

a server configured to communicate with a remote access point and a plurality of disparate data depositories containing electronic information associated with a physical location;

a set of computer readable instructions that when processed by the server are configured to:

retrieve disparate information from at least one disparate data depository, normalize the received data, add a functional overlay to the normalized data, display a floor plan area representing the physical floor plan of at least a portion of the physical location, superimposing a functional overlap representing the physical dimension of elements of the floor plan keyed to marking attributes of the floor plan, receive a selection of a portion of the floor plan for area calculation, calculate the area of the portion of the floor plan selected and create display information representing the area of the portion of the floor plan selected, designate at least a portion of the normalized data and associated functional overlay emergency data, create displa information having normalized data and associated functional overlay emergency data and transmit display information to a remote access point of a first responder, and, create a training program according to the emergency data, associating an individual with the training program and physical location, track the individual through the training program and create training display information having a training status, and transmit display information to the remote access point of the normalization data and the individual's training status in response to a user request.

13. The system of claim 12 wherein the set of computer readable instructions is configured to aggregate the normalize data into one or more of a group selecting from the group comprising electrical, emergency call list, evacuations routes, extinguisher locations, fire protection systems, first aft equipment, shut-offs, hazard material storage, life safety systems, safe rooms, surveillance, and any combination thereof.

14. The system of claim 12 wherein the set of computer readable instructions is configured to associate a monetary value associated with an allocation of costs with the area of the portion of the floor plan selected.

15. The system of claim 12 wherein the set of computer readable instructions is configured to associate a review status to the disparate information indicating whether the disparate information has been reviewed for accuracy.

16. A computerized system for managing, virtualizing and augmenting disparate data comprising:

a server in communications with a remote access point and a plurality of disparate data depositories taken from the group consisting of physical documents, digital documents, third party databases, regulatory databases, budding code databases, construction plans, and any combination thereof;

a set of computer readable instructions that when processed by the server are configured to;

retrieve disparate information from at least one disparate data depository, normalize the received data, add a functional overlay to the normalized data, associate the normalized data with identification data in a many to many relationship providing filtered access to the the normalized data and associated functional overlays, display a floor plan area representing the physical floor plan of at least a portion of the physical location, superimposing a functional overlap representing the physical dimension of elements of the floor plan keyed to marking attributes of the floor plan, receive a selection of a portion of the floor plan for area calculation, calculate the area of the portion of the floor plan selected and create display information representing the area of the portion of the floor plan selected, retrieve regulatory compliance data from a remote regulatory electronic database, determine if a predetermined action has been performed associated with the regulatory compliance data, receive action information associated with preforming of the action, determine if the action resulted in compliance, create display information representing compliance, create a training program according to the regulatory compliance data based on the normalized data and associated functional overlays, associating an individual with the training program and physical location. track the individual through the training program and create training display information having a training status, and transmit display information to the remote access point of the normalized data and the individual's training status in response to a user request.

17. The system of claim 16 wherein the set of computer readable instructions is configured to determine out of compliance information according to the regulatory compliance data and aggregate out of compliance items into an open issues group.

18. The system of claim 17 wherein the set of computer readable instructions is configured to transmit display instructions to the remote access point representing the physical location, receive location selection information representing a portion of the physical location and display the normalized data and functional overlay associated with the selection information representing a portion of the physical location.

* * * * *